United States Patent
Wehrly, Jr.

(10) Patent No.: US 6,893,899 B2
(45) Date of Patent: *May 17, 2005

(54) CONTACT MEMBER STACKING SYSTEM AND METHOD

(75) Inventor: James Douglas Wehrly, Jr., Austin, TX (US)

(73) Assignee: Staktek Group L.P., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/814,531

(22) Filed: Mar. 31, 2004

(65) Prior Publication Data

US 2004/0183206 A1 Sep. 23, 2004

Related U.S. Application Data

(60) Continuation of application No. 10/092,104, filed on Mar. 6, 2002, now Pat. No. 6,806,120, which is a division of application No. 09/819,171, filed on Mar. 27, 2001, now Pat. No. 6,462,408.

(51) Int. Cl.$^7$ .......................... H01L 21/44; H01L 21/48; H01L 21/50; H01L 23/02
(52) U.S. Cl. ....................... 438/109; 257/686
(58) Field of Search ............................... 438/109, 107, 438/119, 123; 257/686, 666, 689, 690, 692, 696, 773

(56) References Cited

U.S. PATENT DOCUMENTS 6,462,408 B1 * 10/2002 Wehrly, Jr. .................. 257/686
6,806,120 B2 * 10/2004 Wehrly, Jr. .................. 438/109

* cited by examiner

Primary Examiner—David A. Zarneke
(74) Attorney, Agent, or Firm—Andrews Kurth LLP

(57) ABSTRACT

A system and method for selectively stacking and interconnecting individual integrated circuit devices to create a high-density integrated circuit module. In a preferred embodiment, conventional thin small outline packaged (TSOP) memory circuits are vertically stacked one above the other. The constituent IC elements act in concert to provide an assembly of memory capacity approximately equal to the sum of the capacities of the ICs that constitute the assembly. The IC elements of the stack are electrically connected through individual contact members that connect corresponding leads of IC elements positioned adjacently in the stack. In a preferred embodiment, the contact members are composed of lead frame material. Methods for creating stacked integrated circuit modules are provided that provide reasonable cost, mass production techniques to produce modules. In a preferred method, a carrier frame of lead frame material is configured to present an opening into which opening project plural lead-like contact members that correspond to the leads of an IC element. The contact members contact the leads of the lower IC element of the stack while the leads of the upper IC of the assembly contact the upper surfaces of the contact members. The stack is assembled using typical surface mount equipment and, after assembly, the carrier portion of the frame is removed to leave the plurality of contact members in place between selected leads.

28 Claims, 11 Drawing Sheets

CONTACT MEMBER STACKING SYSTEM AND METHOD

CROSS REFERENCE TO RELATED APPLICATIONS

This application is a continuation application of U.S. application Ser. No. 10/092,104 filed on Mar. 06, 2002 now U.S. Pat. No. 6,806,120, pending, which is a divisional of U.S. patent application Ser. No. 09/819,171, filed Mar. 27, 2001, issued as U.S. Pat. No. 6,462,408. U.S. patent application Ser. No. 10/092,104 and U.S. patent application Ser. No. 09/819,171 are incorporated by reference for all purposes.

TECHNICAL FIELD OF THE INVENTION

The present invention relates to aggregating integrated circuits and, in particular, to stacking integrated circuits.

BACKGROUND OF THE INVENTION

A variety of techniques are used to stack integrated circuits. Some require that the circuits be encapsulated in special packages, while others use circuits in conventional packages. In some cases, the leads alone of packaged circuits have been used to create the stack and interconnect its constituent elements. In other techniques, structural elements such as rails are used to create the stack and interconnect the constituent elements.

Circuit boards in vertical orientations have been used to provide interconnection between stack elements. For example, in U.S. Pat. No. Re. 36,916 to Moshayedi, a technique is described for creating a multi-chip module from surface-mount packaged memory chips that purportedly uses sideboards to mount the assembly to the main or motherboard. The devices are interconnected on their lead-emergent sides through printed circuit boards (PCBs) oriented vertically to a carrier or motherboard that is contacted by connective sites along the bottom edge of the PCBs. Other systems purport to use sideboard structures such as Japanese Patent Laid-open Publication No. Hei 6-77644 which discloses vertical PCBs used as side boards to interconnect packaged circuit members of the stack.

Others have stacked integrated circuits without casings or carrier plates. Electrical conductors are provided at the edges of the semiconductor bodies and extended perpendicularly to the planes of the circuit bodies. Such a system is shown in U.S. Pat. No. 3,746,934 to Stein.

Still others have stacked packaged circuits using interconnection packages similar to the packages within which the integrated circuits of the stack are contained to route functionally similar terminal leads in non-corresponding lead positions. An example is found in U.S. Pat. No. 4,398,235 to Lutz et al. Simple piggyback stacking of DIPs has been shown in U.S. Pat. No. 4,521,828 to Fanning.

Some more recent methods have employed rail-like structures used to provide interconnection and structural integrity to the aggregated stack. The rails are either discrete elements that are added to the structure or are crafted from specific orientations of the leads of the constituent circuit packages. For example, in U.S. Pat. No. 5,266,834 to Nishi et al., one depicted embodiment illustrates a stack created by selective orientation of the leads of particularly configured stack elements, while in U.S. Pat. No. 5,343,075 to Nishino, a stack of semiconductor devices is created with contact plates having connective lines on inner surfaces to connect the elements of the stack.

More sophisticated techniques have been recently developed for stacking integrated circuits. The assignee of the present invention has developed a variety of such techniques for stacking integrated circuits. In one such method, multiple conventional ICs are stacked and external leads are interconnected with one another by means of a rail assembly. The rails are made of flat strips of metal and the rails define apertures that receive the leads of the discrete IC packages. An example of this system is shown in U.S. Pat. No. 5,778,522 assigned to the assignee of the present invention.

An even more recent technique developed by the assignee of the present invention interconnects conventionally packaged ICs with flexible circuits disposed between stack elements. The flexible circuits include an array of flexible conductors supported by insulating sheets. Terminal portions of the flexible conductors are bent and positioned to interconnect appropriate leads of respective upper and lower IC packages.

Some of the previously described systems have required encapsulation of the constituent ICs in special packages. Still others have added rails that must be custom-fabricated for the application. Many have relied upon connections that substantially coincide with the vertical orientation of the stack and thus require more materials. Many techniques add excessive height to the stack. Others that use PCBs have inhibited heat dissipation of the stack. Most have deficiencies that add expense or complexity or thermal inefficiency to stacked integrated circuits. What is needed, therefore, is a technique and system for stacking integrated circuits that provides a thermally efficient, robust structure while not adding excessive height to the stack yet allowing production at reasonable cost with easily understood and managed materials and methods.

SUMMARY OF THE INVENTION

The present invention provides a system and method for selectively stacking and interconnecting individual integrated circuit devices to create a high-density integrated circuit module. It is principally designed for use with memory circuits, but can be employed to advantage with any type of packaged and leaded integrated circuit where area conservation and use of duplicative circuitry are present considerations.

In a preferred embodiment, conventional thin small outline packaged (TSOP) memory circuits are vertically stacked one above the other. The stack consists of two packaged integrated circuits (ICs), but alternatives may employ greater numbers of ICs. In a stacked module created in accordance with the present invention, the constituent IC elements act in concert to provide an assembly of memory capacity approximately equal to the sum of the capacities of the ICs that constitute the assembly. The IC elements of the stack are electrically connected through individual contact members that connect corresponding leads of IC elements positioned adjacently in the stack. In a preferred embodiment, the contact members are composed of lead frame material. In a preferred embodiment, two TSOP memory circuits are differentially enabled by extension of a conductive runner from one contact member positioned at the no-connect (N/C) lead of the lower TSOP to another contact member connected to chip-enable lead of the upper TSOP.

Methods for creating stacked integrated circuit modules are provided that provide reasonable cost, mass production techniques to produce modules. In a preferred method, a carrier frame of lead frame material is configured to present an opening into which opening project plural lead-like contact members that correspond to the leads of an IC element. The contact members contact the leads of the lower IC element of the stack while the leads of the upper IC of the assembly contact the upper surfaces of the contact members. The stack is assembled using typical surface mount equipment and, after assembly, the carrier portion of the frame is removed to leave the plurality of contact members in place between selected leads.

BRIEF DESCRIPTION OF THE DRAWINGS

For a more complete understanding of the present invention, and the advantages thereof, the following description is made with reference to the accompanying drawings, in which.

DETAILED DESCRIPTION OF THE PREFERRED EMBODIMENTS

Figure 1:
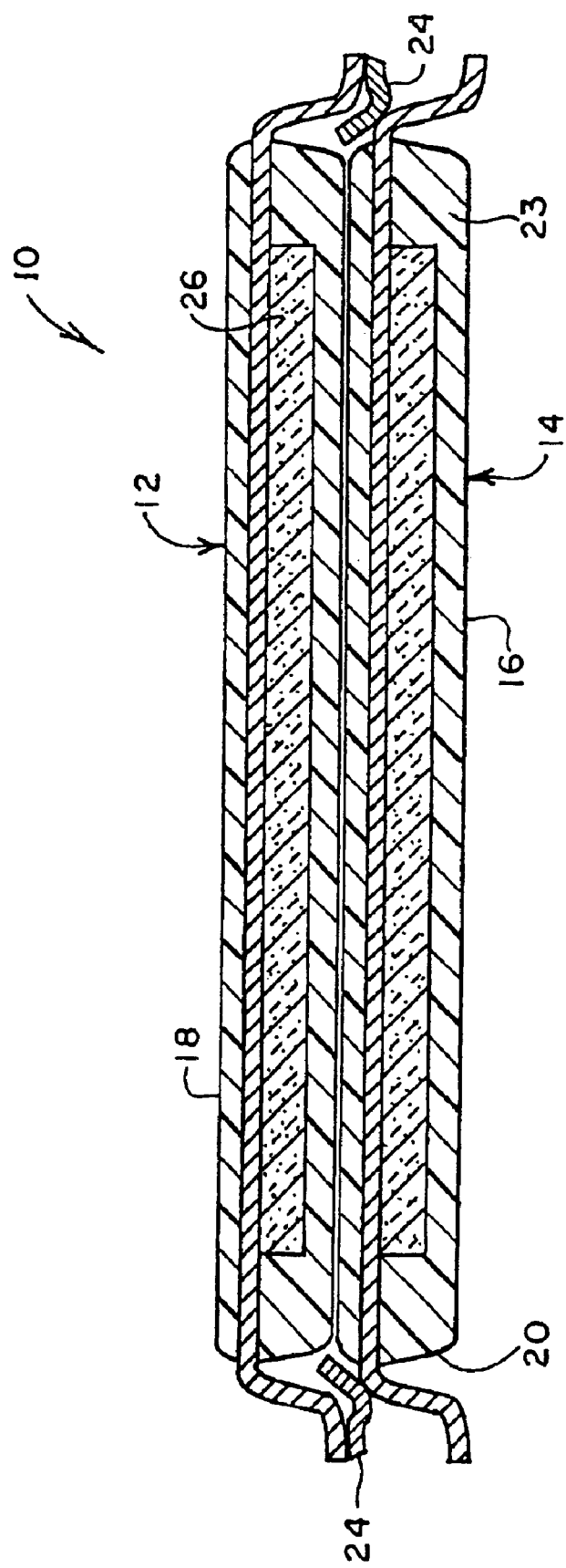
FIG. 1 is a cross-sectional view of a circuit module devised in accordance with the present invention.

FIG. 1 depicts a high-density memory module 10 devised in accordance with the present invention. The present invention is adaptable to a variety of IC circuits and, in its preferred implementation, memory circuits of a variety of capacities. Module 10 is created with upper IC 12 and lower IC 14. Each of ICs 12 and 14 are, in the depicted preferred embodiment, plastic encapsulated memory circuits disposed in thin small outline packages known as TSOPs. Other package types may be used with the present invention as well as packaged circuits other than memories, but, as described here as preferred examples, the invention is advantageously implemented with memories in TSOP packaging. Each IC has a lower surface 16, upper surface 18 and periphery 20. Each of ICs 12 and 14 include an integrated circuit 26 encapsulated by a plastic body 23. As shown, contact members 24 provide connection between corresponding leads on ICs 12 and 14.

In this embodiment, due to the configuration of contact members 24, the bodies 23 of IC 12 and IC 14 are in direct contact with top surface 18 of lower IC 14 in direct contact with lower surface 16 of upper IC 12. In alternative embodiments, a thermal media or adhesive may be employed to encourage heat transference between ICs 12 and 14 in the thermal path to a mounting board.

Figure 2:
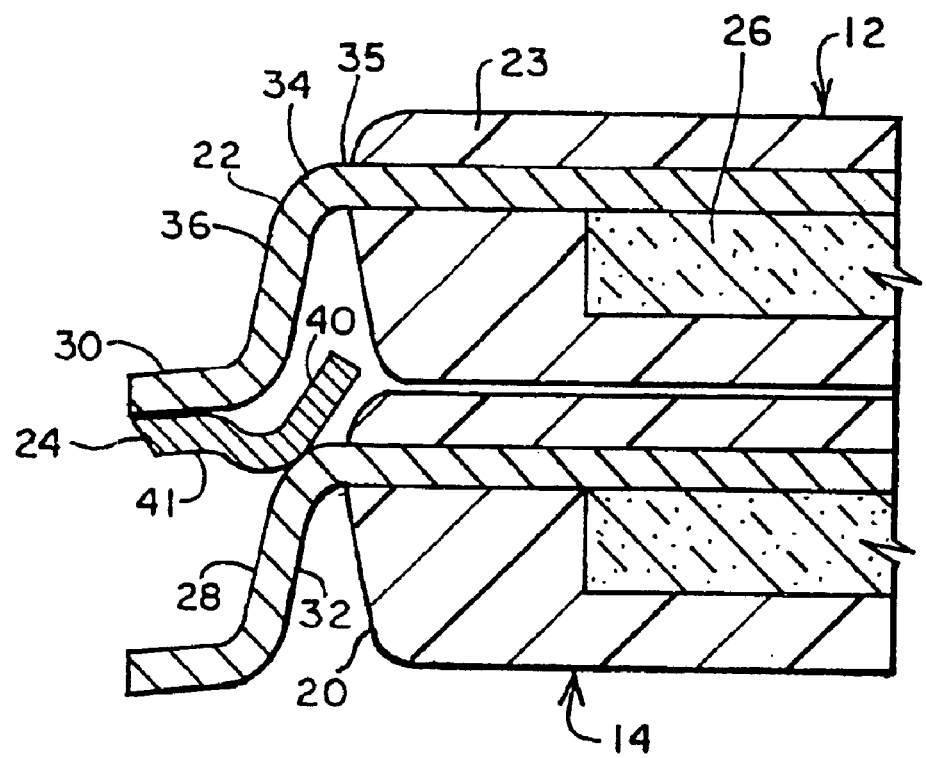
FIG. 2 is a cross-sectional view of a connection between two integrated circuits in the embodiment depicted in FIG. 1.

As depicted in FIG. 2, emergent from package peripheral wall 20, leads such as illustrated lead 22, provide a connective pathway for the electronics of the circuitry chip 26 embedded within plastic casing 23 of exemplar IC 12. Lead 22 of upper IC 12 is shown as having foot 30, shoulder 34 and a transit section 36. Shoulder 34 can extend from and include the planar part of lead 22 emergent from peripheral wall 20 (i.e., the "head" of the shoulder identified by reference 35) to the end of the curvature into transit section 36. Lead 22 of lower IC 14 is referenced to illustrate the outer surface 28 and inner surface 32 present in leads 22 10 of both upper IC 12 and lower IC 14. Outer surface 28 and inner surface 32 extend along the topological features of foot, transit section and shoulder and head identified with respect to lead 22 of upper IC 12 and it will be understood by those of skill in the art that the two surfaces, inner and outer, are exhibited by leads of TSOPs and other leaded packaged integrated circuits. These features of leads 22 are present in conventional TSOP packaged memory circuits available from most major suppliers of memories such as Samsung and Micron Technology, for example. Foot 30 is provided to allow the mounting of the TSOP on the surface of a printed circuit or other carrier or signal transit board. Shoulder 34 arises from providing foot 30 for surface mount connection of the IC, while transit section 36 of lead 22 connects shoulder 34 with foot 30. In practice, lead 22 and, in particular, transit section 36 are surfaces from which heat from internal chip 26 is dissipated by local air convection. Transit section 36 is often a substantially straight path but may exhibit curvature.

The present invention interposes contact members such as exemplar contact member 24 shown in FIG. 2 between selected leads of module 10. In a preferred embodiment, a contact member is disposed between each pair of corresponding leads in the assembly. In a preferred embodiment, contact member 24 is comprised of lead frame material. A material known in the art as alloy 42 is one preferred material for contact members 24. It should be recognized, however, that other conductive materials may be used for contact members 24.

Figure 3:
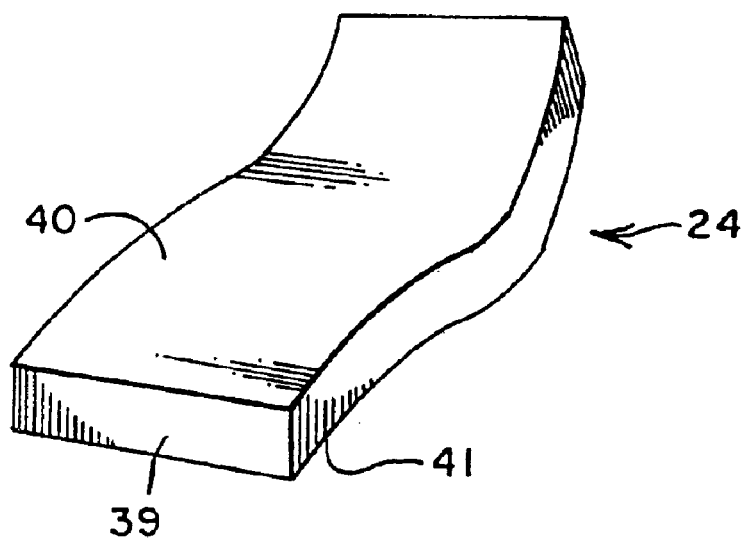
FIG. 3 depicts a contact member according to a preferred embodiment of the present invention.

In a preferred embodiment, because contact member 24 is derived from a frame carrier, the configuration of a contact member 24 exhibits an approximately rectangular cross-section as shown at reference 39 in FIG. 3 and has first and second major surfaces identified by reference numerals 40 and 41, respectively. In a preferred embodiment of module 10, first major surface 40 of contact member 24 is disposed to contact inner surface 32 of lead 22 of upper IC 12 and second major surface 41 of contact member 24 is disposed to contact outer surface 28 of lead 22 of lower IC 14. This contact between contact member 24 and leads 22 is realized, in a preferred embodiment, with solder at the contact there between. In this depicted embodiment, illustrated contact member 24 contacts foot 30 of example lead 22 of upper IC 12 and shoulder 34 of example lead 22 of lower IC 14. In a preferred embodiment, contact member 24 is configured to fit beneath lead 22 of upper IC 12 and above lead 22 of lower IC 14. While being in contact with the leads, it should be understood that the contact members 24 (as well as later described modified contact members 25 and 27) may have an extent greater or lesser as well as coincident with the feet of the leads of ICs 12 and 14.

In a basic preferred embodiment, contact member 24 does not lift lower surface 16 of upper IC 12 from upper surface 18 of lower IC 14 when positioned to contact the inner surface 32 of lead 22 of upper IC 12 and outer surface 28 of lead 22 of lower IC 14. There are alternative embodiments of the present invention that employ thermally conductive media adhesives or layers between ICs 12 and 14, but the consequent distancing between lower surface 16 of upper IC 12 from upper surface 18 of lower IC 14 is a function of that interposed layer.

Figure 4:
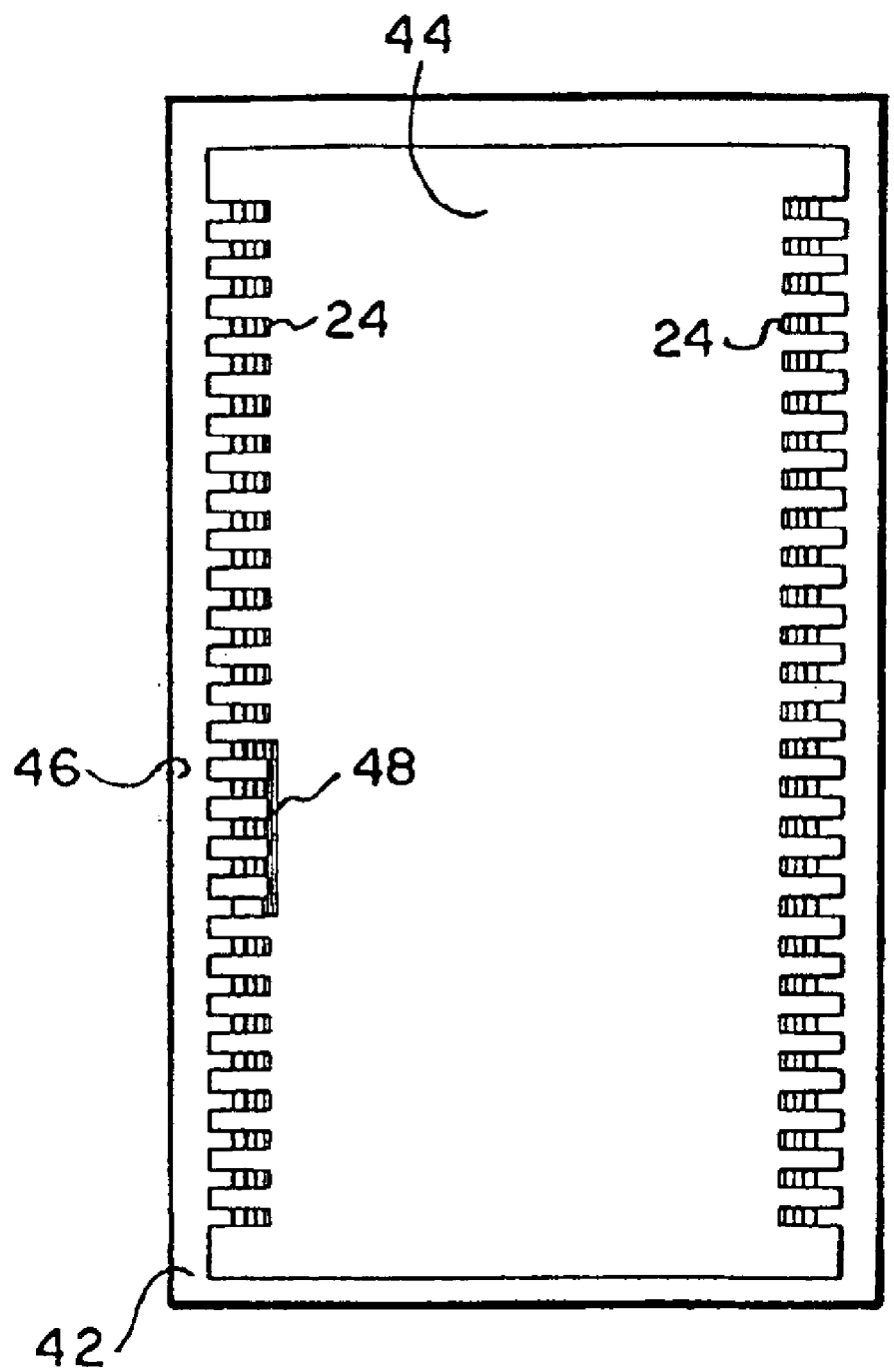
FIG. 4 is an upper plan view of the carrier frame of a preferred embodiment of the present invention.

FIG. 4 depicts a carrier frame 42 employed in a preferred embodiment of the present invention to construct module 10. As shown in FIG. 4, carrier frame 42 has a window 44 into which extend from body 46 of carrier frame 42, a plurality of contact members 24. In a preferred embodiment, carrier frame 42 is photo-etched or created with progressive die forming. If photo-etched, frame 42 will be further processed through a forming die. Use of known material such as alloy 42 for carrier frame 42 allows coefficients of thermal expansion to be matched with the ICs employed in the module.

In a two-IC module, IC 12 is positioned to make contact with the first major surfaces 40 of contact members 24 with the inner surfaces 32 of the feet 30 of its leads 22. Carrier frame 42 is set upon lower IC 14 to realize contact between the outer surfaces 28 of leads 22 of lower IC 14 and the second major surfaces 41 of contact members 24. As those of skill will recognize, pick & place and other similar tools provide well known techniques for implementing the assembly step in the method of the present invention. The connections are solder realized through any of several well-known methods including solder flux and reflow oven for example. After assembly, the contact members are cut-away from carrier frame 42 to free the assembled module 10. The body portion 46 of the frame 42 is removed after assembly by cutting, punching, milling, laser trimming or any of the techniques well understood in the art. Carrier frame 42 may provide dimples or other similar features for simplified removal of the module.

Conductive runner 48 extends, in a preferred embodiment, from a modified contact member that corresponds to a no-connect lead of the constituent ICs of the module to a modified contact member that corresponds in position to the chip-enable lead of the upper ICs of module 10. Such conductive runners can be used for isolation or selective enablement on either side of the module where appropriate.

In a preferred embodiment that employs standard TSOPs as the constituent ICs of the module, conductive runner 48 extends from N/C lead number 15 to chip-enable (CE) lead number 19. To provide the selective enablement of the constituent ICs, conductive runner 48 can contact the N/C lead of either the lower IC or both ICs, but contacts only the CE lead of upper IC 12. Consequently, the signal to enable upper IC 12 of module 10 can be applied to the N/C lead of lower IC 14 and conveyed by conductive runner 48 to the CE lead of upper IC 12. Other similar enablement schemes can be effectuated with conductive runner 48 positioned to provide differential enablement corresponding to the topology and internals of the ICs that make up module 10.

Figure 5:
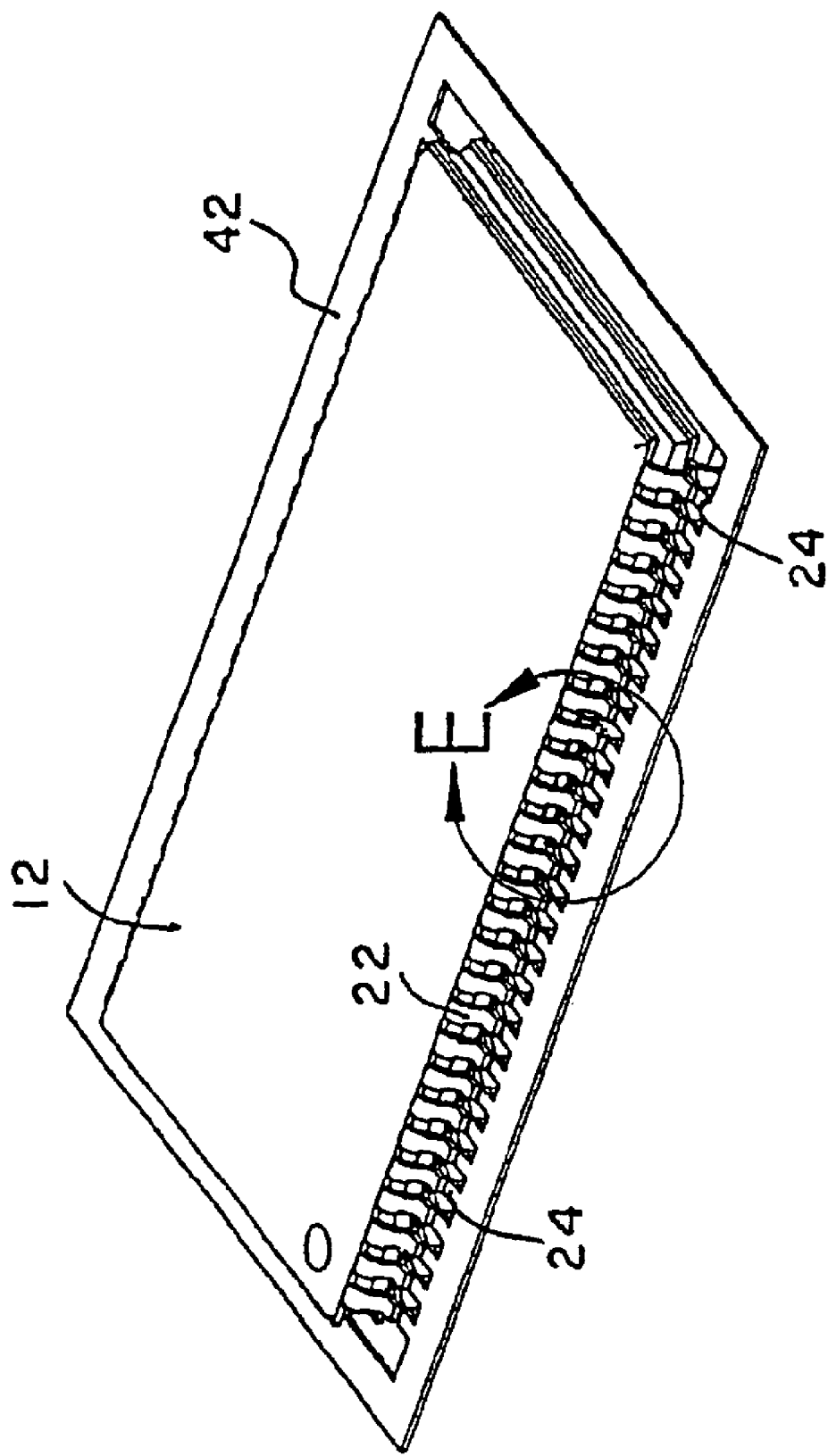
FIG. 5 is a perspective view of a stacked module under construction according to a preferred method of the present invention.

FIG. 5 is a perspective view of a stacked module under construction according to a preferred method of the present invention. Carrier frame 42 is shown having multiple contact members 24 extending into window 44. Lower IC 14 is positioned to allow contact members 24 to contact the outer surfaces 28 of leads 22, while upper IC 12 is set down on carrier frame 42 to allow contact members 24 to contact inner surfaces 32 of leads 22.

Figure 6:
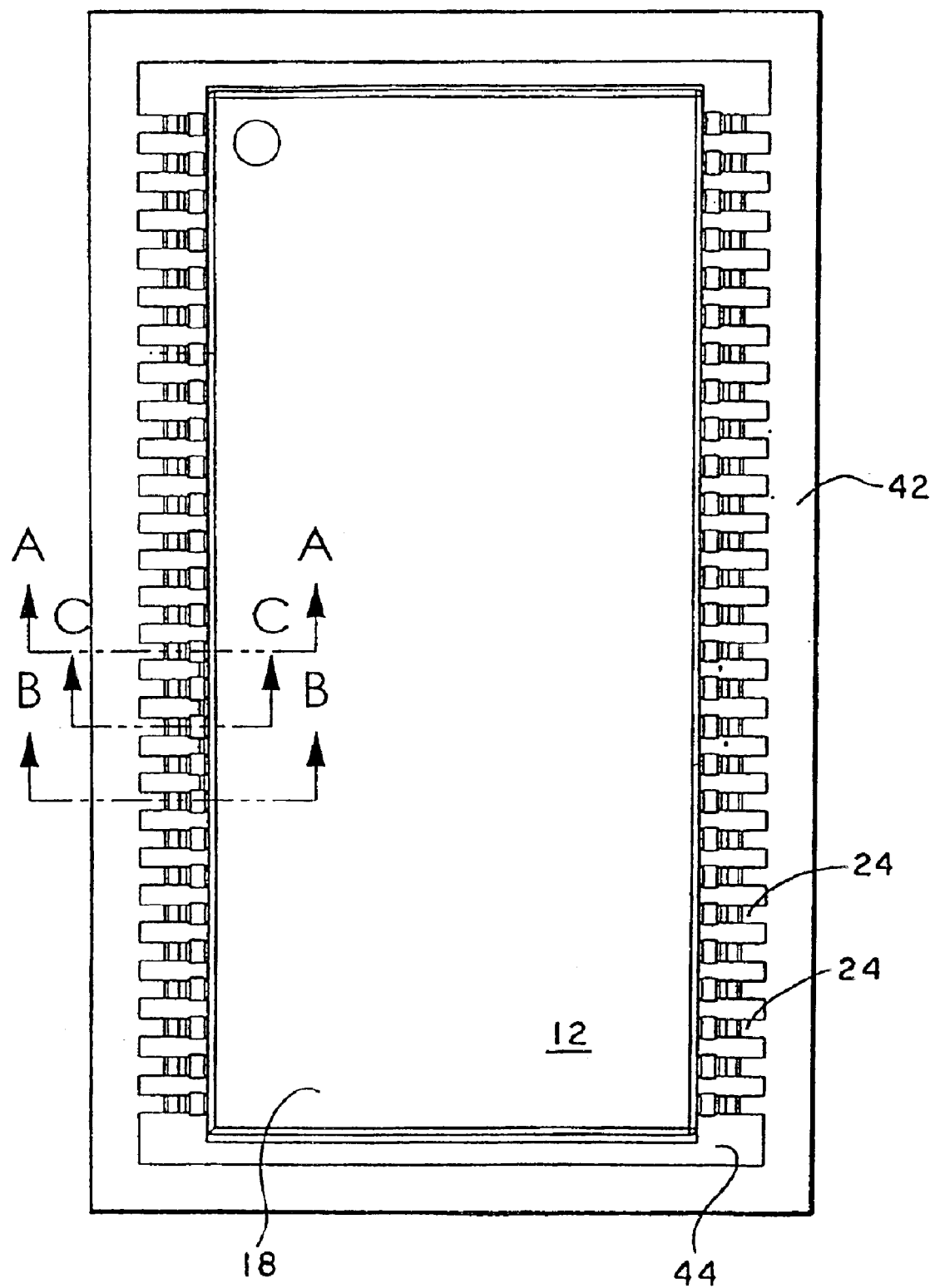
FIG. 6 is an upper plan view of a stacked module under construction according to a preferred embodiment of the present invention.

FIG. 6 is an upper plan view of a stacked module under construction according to a preferred embodiment of the present invention. FIG. 6 depicts upper IC 12 placed upon the array of contact members 24 that extend into window 44 from carrier frame 42.

Figure 7:
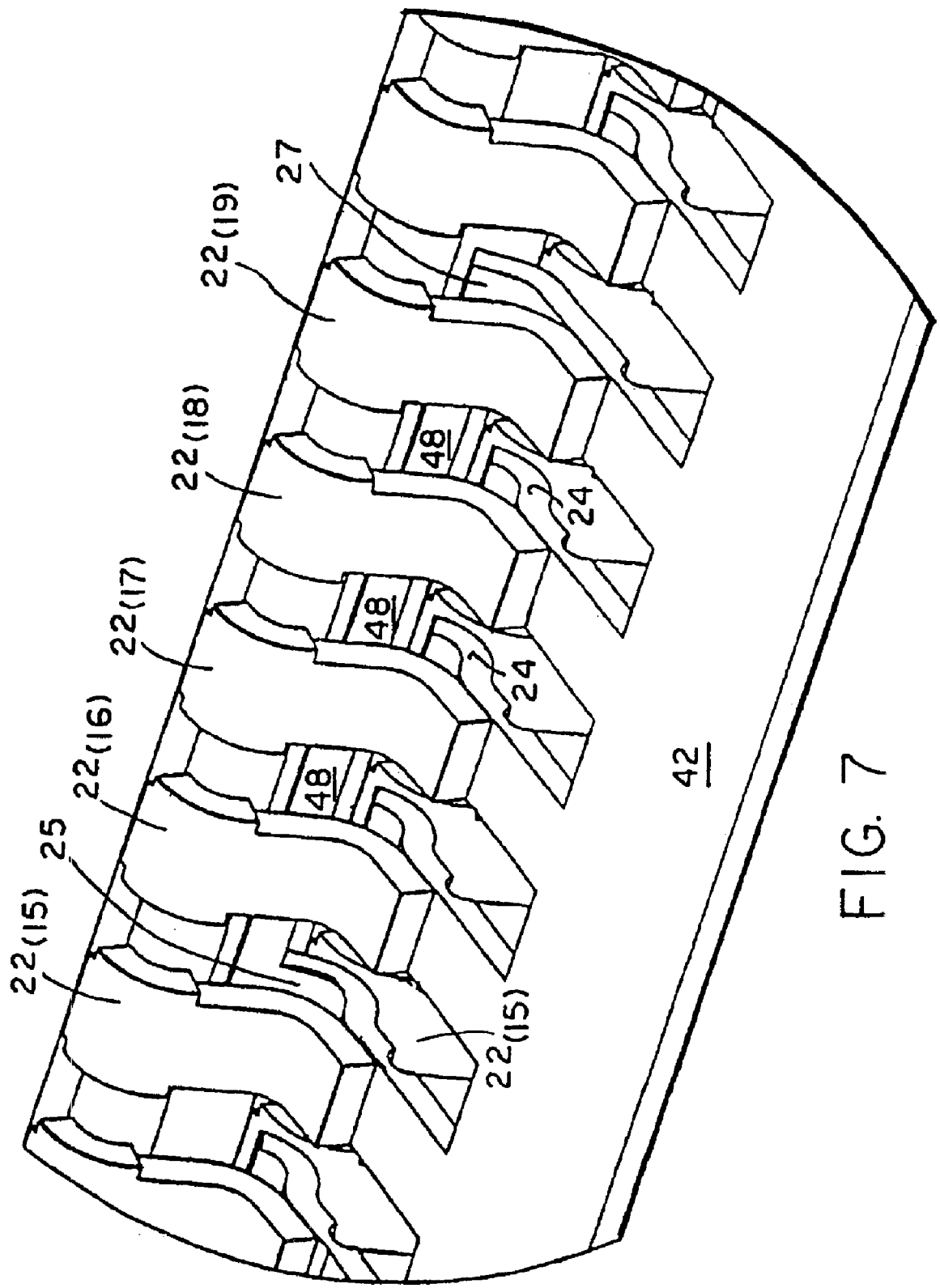
FIG. 7 shows an enlarged detail from FIG. 5.

FIG. 7 shows an enlarged detail depicting an area that illustrates the conductive runner 48. Depicted lead 22(15) is the lead of upper IC 12 at position 15 along line A—A of FIG. 6. Lead 22(15) is a N/C lead as is the corresponding lead 22(15) of lower IC 14 shown positioned below modified contact member 25 that merges into conductive runner 48 shown extending behind leads 22(16), 22(17), 22(18), and 22(19) to merge with modified contact member 27. Depicted lead 22(19) is the lead of upper IC 12 at position 19 along line B—B of FIG. 6 and is, in a preferred embodiment, the chip-enable lead for upper IC 12. As shown in further detail in later FIG. 10, modified contact member 27 does not contact the corresponding lead 22(19) of lower IC 14. Consequently, a chip-enable signal intended to enable upper IC 12, may be applied to lead 22(15) of lower IC 14 through that lead's contact with a main or motherboard. That enable signal may then be conveyed through conductive runner 48 to lead 22(19) of upper IC 12.

Figure 8:
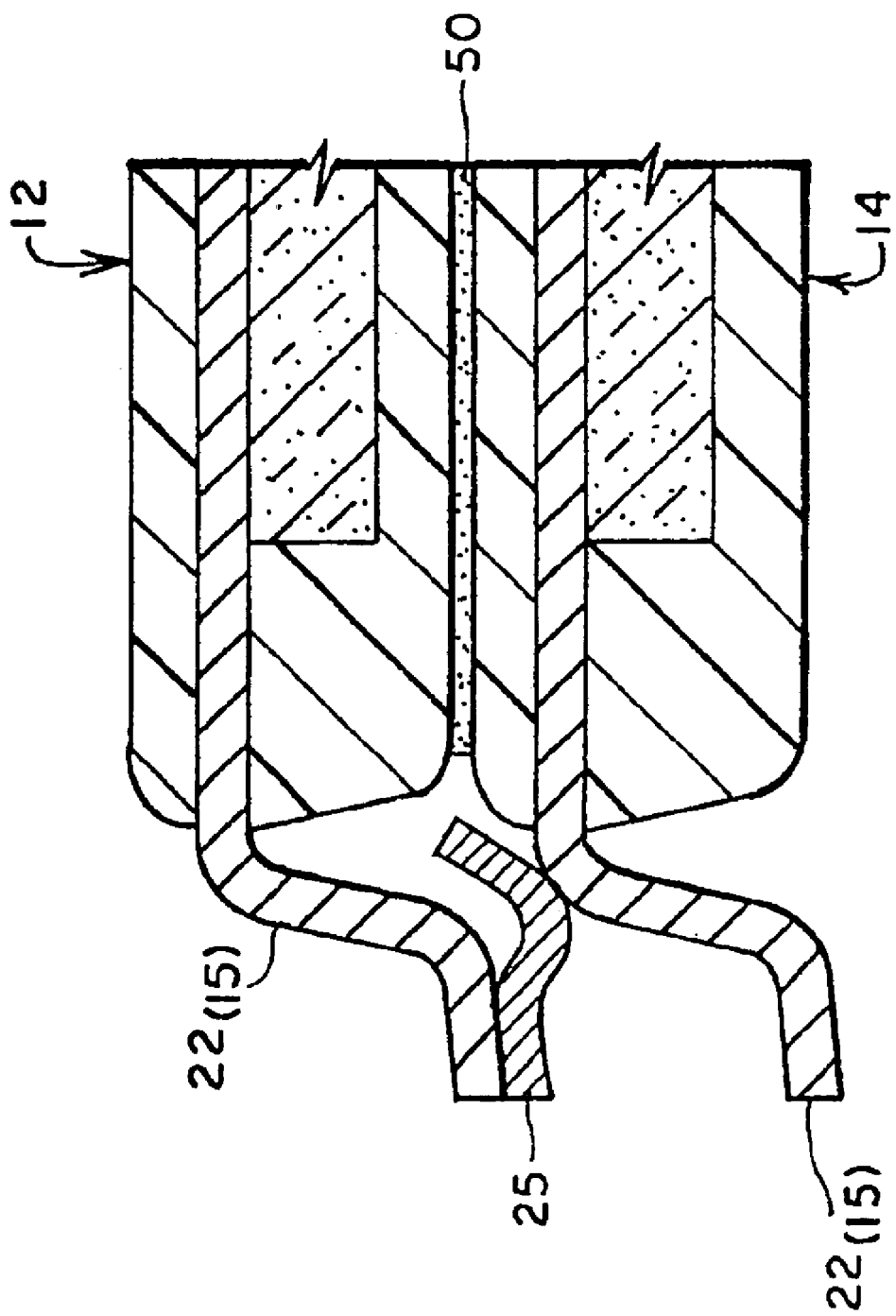
FIG. 8 depicts a sectional view of the contact member and conductive structure along line A—A of FIG. 6.

FIG. 8 depicts a sectional view of the contact member and conductive structure along line A—A of FIG. 6. FIG. 8 illustrates the contact member and lead relationship at lead 22(15) shown earlier in FIG. 7. As shown in FIG. 8, modified contact member 25 contacts corresponding leads 22(15) of upper and lower ICs 12 and 14, respectively. It should be understood that conductive runner 48 merges into modified contact member 25 to convey a chip enable signal supplied to lead 22(15) of lower IC 14 to chip enable lead 22(19) of upper IC 12. This is a preferred embodiment view, but those of skill in the art will recognize that modified contact member 25 may, in alternative embodiments, contact just lead 22(15) of lower IC 14. Modified contact member 25 need merely be in position to acquire a chip-enable signal supplied to a N/C lead of lower IC 14. Conventionally, module 10 is mounted to a main board through mounting the feet of the leads of the lower IC of module 10. As shown in FIG. 8, upper IC 12 and lower IC 14 can be separated by a thermal material 50 which, in a preferred embodiment, may be a thermally conductive adhesive although other thermally conductive materials may occupy this position.

Figure 9:
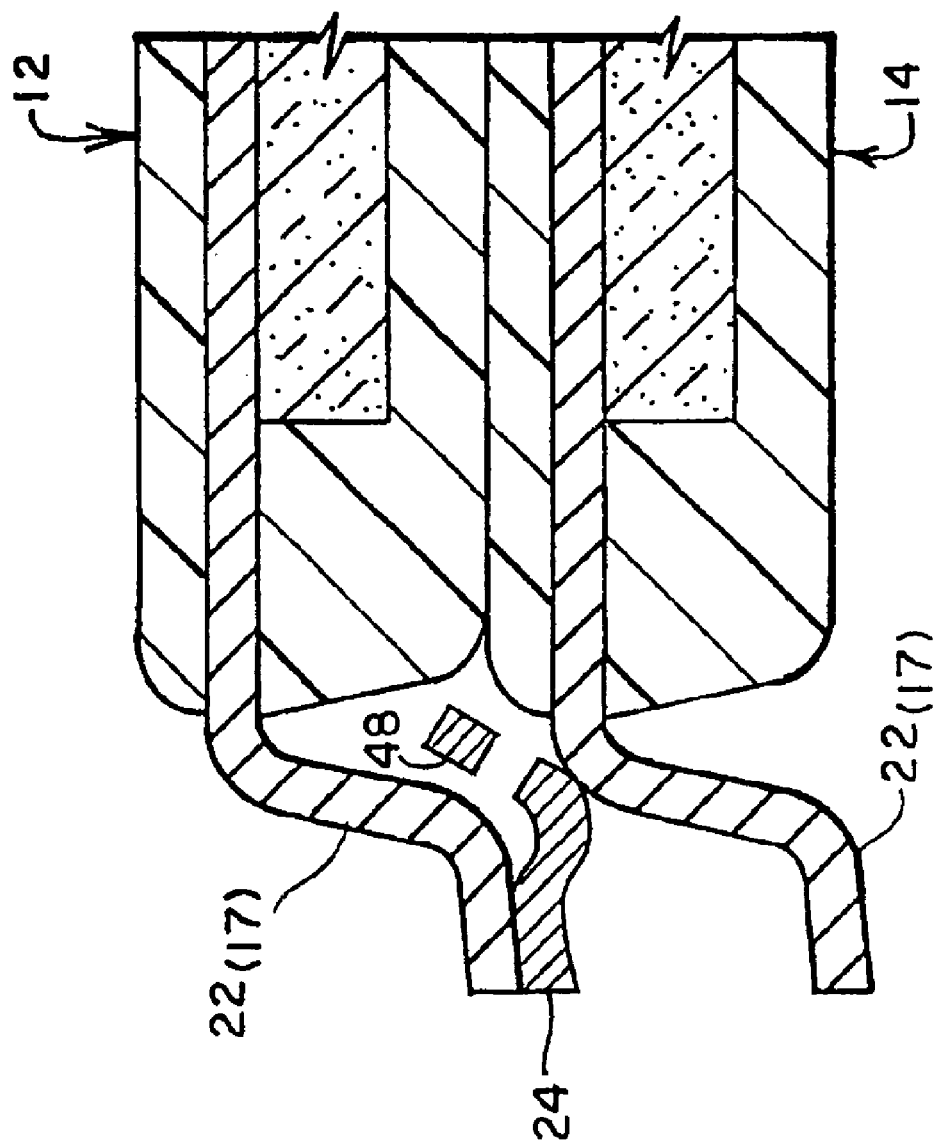
FIG. 9 depicts a sectional view of the contact member and conductive runner structure along line C—C of FIG. 6.

FIG. 9 depicts a sectional view of the contact member and conductive runner structure along line C—C of FIG. 6. As shown in FIG. 9, contact member 24 contacts corresponding leads 22.(17) of upper IC 12 and lower IC 14. Also shown is conductive runner 48 as it passes underneath lead 22(17) and distanced from contact with contact member 24 at this site.

Figure 10:
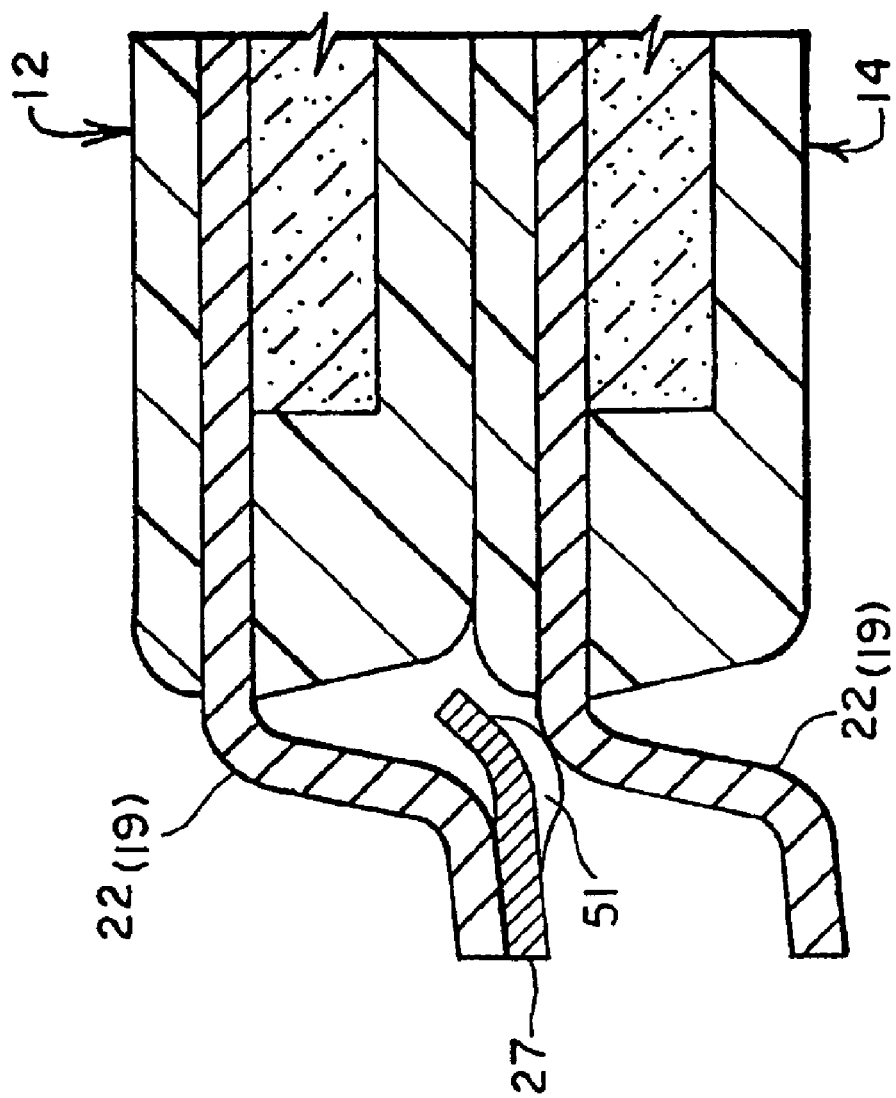
FIG. 10 depicts a sectional view of the contact member and conductive runner structure along line B—B of FIG. 6.

FIG. 10 depicts a sectional view of the contact member and conductive runner structure along line B—B of FIG. 6. As shown in FIG. 10, modified contact member 27 is shown in contact with lead 22(19) of upper IC 12. The signal applied to modified contact 25 shown in FIG. 8 has been conveyed along conductive runner 48 that merges with modified contact member 27 in the vicinity of lead 22(19). In a preferred embodiment, modified contact member 27 is distanced from lead 22(19) of lower IC 14 by insulative material 51 although in alternative constructions, other methods of avoiding contact are available such as simple distance. Lead 22(19) is the chip-enable position on a TSOP in a preferred embodiment. Consequently, the chip-enable signal intended for enablement of upper IC 12 has been applied to foot 30 of lead 22(15) of lower IC 14 and conveyed along conductive runner 48 to modified contact member 27 which conveys the enable signal to the chip-enable lead of upper IC 12.

The provision of the contact member structures provides structural and fabrication advantages not found in previous structures. For example, such a method and structure exploits the existing lead assemblage of the constituent ICs to craft a module defining cage or framework. Although the leads are provided by the TSOP manufacturer to enable surface mounting (SMT) of the TSOP, employment of contact member structures 24 of the present invention provides advantages to the lead assemblage, namely, a low capacitance conductive pathway that allows superior thermal performance and simple stack construction and inter-connectivity with structural integrity and appropriate height.

Figure 11:
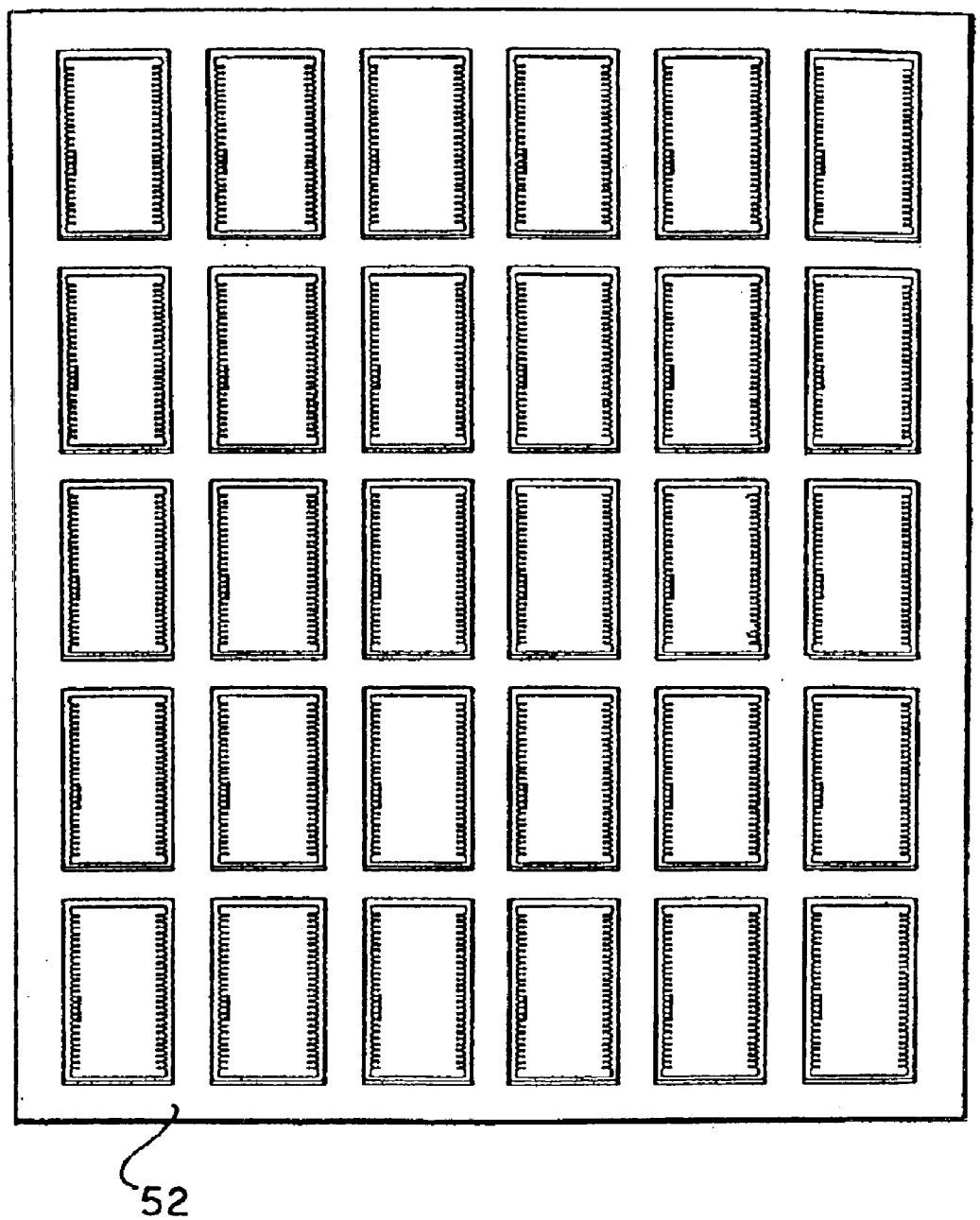
FIG. 11 depicts a carrier frame bed employed by a preferred embodiment of the present invention.
Figure 12:
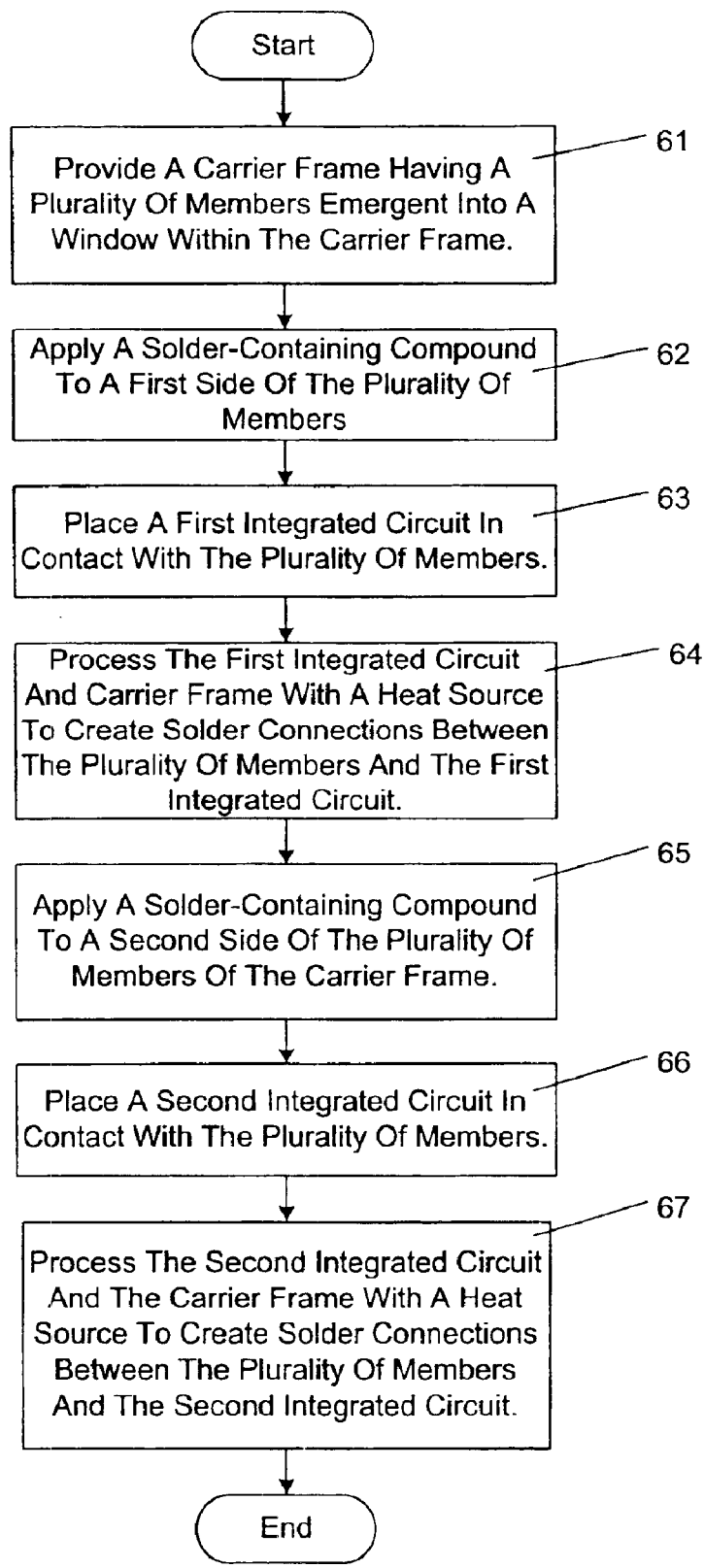
FIG. 12 shows a flow diagram for creating an integrated circuit stack according to one embodiment of the present invention.

FIG. 11 illustrates a lead frame-material carrier panel 52 consisting of multiple carrier frame areas 42. In one method of a preferred embodiment of the invention, solder paste, a combination of solder and flux, is applied to one side of the carrier panel 52. The solder paste is applied to the members of the carrier panel that will become the contact members 24. Once the solder paste has been applied, upper IC 12 is positioned with its feet 30 in contact with the solder paste. As those of skill will recognize, although many techniques are available for that placement, a common surface mount pick & place tool is suitable. The assembly is then processed through a reflow oven to create solder joints at the contact areas.

The resulting assembly is inverted and solder paste applied to the lower surface of carrier panel 52. Solder paste is not applied to areas where no joint is intended. For example, on the lower side of the carrier frame area 42 feature that will, in the finished preferred embodiment, become modified contact member 27 through which the chip select signal is applied to upper IC 12 at lead 22.sub.(19), no solder paste is applied. Lower ICs 14 are placed onto the lower side of the carrier panel 52 so that the shoulder of IC leads 22 are in contact with the solder paste applied to contact members. The assembly is then processed again through a reflow oven. Alternatively, the lower side may be processed first followed by the upper side assembly process.

In an alternative method, a holding fixture is incorporated to hold and locate the ICs for either side. Solder paste is then applied to both sides of carrier panel 52 which is subsequently placed into the fixture with the leads of the ICs in the fixture contacting one side of the carrier panel 52. The other side of the carrier panel is then populated with pick & place techniques. The entire assembly is then processed through a reflow oven creating solder connections on both upper and lower sides with one pass.

The resulting assembly is an array of stacked devices inter-connected by the lead frame carrier. Individual modules 10 are then singulated from the carrier panel or frame at the place where the ends of leads 22 of upper ICs 12 meet the lead frame carrier area 42. This can be accomplished by any of several known methods including but not limited to mechanical punch, abrasive saw, milling, laser cutting, and mechanical fatigue. Although the present invention has been described in detail, it will be apparent that those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

What is claimed is:

1. A method of creating a stack of integrated circuits selectively connected to provide increased memory density in an application, the method comprising the steps of:

providing a carrier frame configured to have a plurality of members emergent into a window within the carrier frame;

applying a first portion of a solder-containing compound to the first side of the plurality of members;

placing a first packaged integrated circuit having external leads extending away from the packaged integrated circuit in contact with the plurality of members;

processing the first integrated circuit and the carrier frame with a heat source to create a first set of solder connections between the plurality of members and a plurality of the external, extending away, leads of the first packaged integrated circuit;

applying a second portion of a solder-containing compound to the second side of the plurality of members of the carrier frame;

placing a second packaged integrated circuit having external leads extending away from the second packaged integrated circuit in contact with the plurality of members; and processing the second integrated circuit and the carrier frame with a heat source to create a second set of solder connections between the plurality of members and a plurality of the external, extending away, leads of the second integrated circuit.

2. A circuit module comprised of:

a first packaged integrated circuit in electrical communication with a second packaged integrated circuit, each of the first and second packaged integrated circuits having a peripheral wall, emergent from first and second sides of said peripheral wall are leads that each have an outer surface and an inner surface;

a plurality of individual contact members for providing the electrical communication between corresponding leads of the first and second packaged integrated circuits, the contact members being configured to have first and second major sides and being disposed to contact on their first major sides, the inner surface of leads of the first packaged integrated circuit and contact on their second major sides, the outer surface of leads of the second packaged integrated circuit, the contact members each having a proximal end and a distal end, the proximal end disposed to point toward the first packaged integrated circuit.

3. The circuit module of claim 2 in which the first and second packaged integrated circuits each have upper and lower surfaces and the upper surface of the second packaged integrated circuit is in contact with the lower surface of the first packaged integrated circuit.

4. The circuit module of claim 2 in which the first and second packaged integrated circuits are separated by a thermal adhesive.

5. The circuit module of claim 2 in which the contact members are composed of lead frame material.

6. The circuit module of claim 5 in which the contact members are composed of alloy 42.

7. The circuit module of claim 2 in which the contact members exhibit a rectangular cross section.

8. The module of claim 2 in which a conductive runner merges with a first selected contact member in contact with a no connect lead of the second packaged integrated circuit to convey a select signal to a chip enable lead of the first packaged integrated circuit.

9. The module of claim 2 in which the first packaged integrated circuit has a bottom surface presenting a lateral extent spanning from a first periphery to a second periphery of the first packaged integrated circuit, and in which the contact are each disposed so as to not extend into a space bounded on one side by the lateral extent.

10. A high-density memory module comprising:
a first TSOP having a bottom major surface;
a second TSOP positioned in conjunction with the first TSOP to align corresponding leads of the first and second TSOPs;
a plurality of contact members, each contact member having upper and lower major surfaces and each selected contact member being disposed to contact with its upper major surface, the inner surface of a selected lead of the first TSOP and contact with its lower major surface, the outer surface of a corresponding selected lead of the second TSOP, each contact member being disposed outside of a region above and below the bottom major surface of the first TSOP.

11. The module of claim 10 in which the contact between major surfaces of the contact members and the leads of the TSOPs is realized with solder.

12. The module of claim 10 in which the first and second TSOPs are separated by a thermally conductive medium.

13. The module of claim 12 in which the thermally conductive medium is an adhesive.

14. The module of claim 10 in which the contact members are each elongated to have a proximal end and a distal end, the distal end disposed to point substantially away from the TSOPs.

15. The module of claim 10 in which the contact members are each elongated to have a proximal end and a distal end, the proximal end disposed to point substantially toward the TSOPs.

16. A circuit module comprised of:
a first packaged integrated circuit and a second packaged integrated circuit, each of the first and second packaged integrated circuits having an upper surface, a lower surface having a lateral extent, and a peripheral wall, emergent from first and second sides of said peripheral wall are leads that each have a shoulder and foot and an inner surface and an outer surface;
first and second contact members, each having a first major surface and a second major surface, the first contact member being disposed to provide electrical communication between corresponding first leads emergent from first sides of the first and second packaged integrated circuits, respectively and the second contact member being disposed to provide electrical communication between corresponding second leads emergent from second sides of the first and second packaged integrated circuits respectively by contact between the first major surface of the first contact member and the inner surface of the first lead of the first packaged integrated circuit and contact between the first major surface of the second contact member and the inner surface of the second lead of the first packaged integrated circuit while the second major surface of the first contact member is in contact with the outer surface of the first lead of the second packaged integrated circuit and the second major surface of the second contact member is in contact with the outer surface of the second lead of the second packaged integrated circuit to provided electrical communication between the first and second packaged integrated circuits of the module, the first and second contact members being disposed outside of the lateral extent of the lower surface of the first packaged integrated circuit such that the first and second contact members are not disposed above or below any portion of the lower surface of the first packaged integrated circuit.

17. The module of claim 16 in which the contact between the first and second major surfaces of the contact members and the inner and outer surfaces of the first and second leads is electrical contact effectuated by solder.

18. The module of claim 16 in which the upper surface of the second packaged integrated circuit is in contact with the lower surface of the first packaged integrated circuit.

19. The module of claim 16 in which the upper surface of the second packaged integrated circuit is separated from the lower surface of the first packaged integrated circuit by thermal media.

20. The module of claim 16 in which the first and second contact members are elongated and have proximal ends pointing substantially toward the first or second integrated circuit.

21. The module of claim 20 in which the proximal ends point toward the first integrated circuit.

22. A circuit module comprised of:
a first packaged integrated circuit in electrical communication with a second packaged integrated circuit, each of the first and second packaged integrated circuits having a peripheral wall, emergent from first and second sides of said peripheral wall are leads that each have an outer surface and an inner surface;
a plurality of individual contact members for providing the electrical communication between corresponding leads of the first and second packaged integrated circuits, the contact members being configured to have first and second major sides and being disposed to contact on their first major sides, the inner surfaces of leads of the first packaged integrated circuit and contact on their second major sides, the outer surfaces of leads of the second packaged integrated circuit, the contact members disposed outside of a respective proximal plane extending along and perpendicular to a respective proximal lateral edge of a lower surface of the first packaged integrated circuit.

23. The circuit module of claim 22 in which the first and second packaged integrated circuits each have upper and lower surfaces and the upper surface of the second packaged integrated circuit is in contact with the lower surface of the first packaged integrated circuit.

24. The circuit module of claim 22 in which the first and second packaged integrated circuits are separated by a thermal adhesive.

25. The circuit module of claim 22 in which the contact members are composed of lead frame material.

26. The circuit module of claim 25 in which the contact members are composed of alloy 42.

27. The circuit module of claim 22 in which the contact members exhibit a rectangular cross section.

28. The module of claim 22 in which a conductive runner merges with a first selected contact member in contact with a no connect lead of the second packaged integrated circuit to convey a select signal to a chip enable lead of the first packaged integrated circuit.

* * * * *